United States Patent
Ozawa et al.

(10) Patent No.: US 7,838,998 B2
(45) Date of Patent: Nov. 23, 2010

(54) MOUNTING SUBSTRATE AND SEMICONDUCTOR DEVICE

(75) Inventors: Takashi Ozawa, Nagano (JP); Yasushi Araki, Nagano (JP); Masatoshi Nakamura, Nagano (JP); Seiji Sato, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 697 days.

(21) Appl. No.: 11/560,076

(22) Filed: Nov. 15, 2006

(65) Prior Publication Data

US 2007/0108628 A1 May 17, 2007

(30) Foreign Application Priority Data

Nov. 16, 2005 (JP) ............................. 2005-331708

(51) Int. Cl.
*H01L 23/48* (2006.01)
(52) U.S. Cl. .................. 257/778; 257/678; 257/734; 257/779; 257/772; 257/E23.023; 257/E23.079
(58) Field of Classification Search ................ 257/778, 257/772, E23.23, E23.079, 678, 734, 779
See application file for complete search history.

(56) References Cited

U.S. PATENT DOCUMENTS 6,777,814 B2 * 8/2004 Iwasaki et al. .............. 257/778

FOREIGN PATENT DOCUMENTS

| JP | 2001-15554 | 1/2001 |
| JP | 2004-207296 | 7/2004 |
| JP | 2005-175261 | 6/2005 |

* cited by examiner

*Primary Examiner*—Cuong Q Nguyen
*Assistant Examiner*—Trang Q Tran
(74) *Attorney, Agent, or Firm*—Rankin, Hill & Clark LLP

(57) ABSTRACT

A mounting substrate for mounting a semiconductor chip in a flip chip manner, having a plurality of connection pads to which the semiconductor chip is connected, an insulating pattern formed so as to cover a part of the connection pads, and a plurality of dummy patterns for controlling a flow of an underfill infiltrated below the semiconductor chip, characterized in that the plurality of dummy patterns are arranged in staggered lattice shape.

5 Claims, 7 Drawing Sheets

MOUNTING SUBSTRATE AND SEMICONDUCTOR DEVICE

TECHNICAL FIELD

The present disclosure relates to a mounting substrate for mounting a semiconductor chip in a flip chip manner, and a semiconductor device in which the semiconductor chip is mounted on the mounting substrate in a flip chip manner.

RELATED ART

In a method for mounting a semiconductor chip, methods of various types have been proposed but, for example, a method for mounting a semiconductor chip in a flip chip manner has a feature in which it is easy to miniaturize and thin a package.

FIG. 8 is a plan diagram showing one example of a configuration of a mounting substrate for mounting a semiconductor chip in a flip chip manner.

Referring to FIG. 8, a mounting substrate 10 shown in the present drawing has a structure in which connection pads 13 for being connected to a semiconductor chip are formed in an insulating layer 11 and both ends of the connection pads are respectively covered with solder resist layers 12A, 12B.

A semiconductor chip 14 to be mounted on the mounting substrate 10 is mounted so that connection parts (not shown) such as a solder bump formed in an electrode of the semiconductor chip 14 are electrically connected to the connection pads 13.

Also, a resin called an underfill is infiltrated between the semiconductor chip 14 and the mounting substrate 10, and insulation of adjacent connection parts (connection pads) is achieved.

[Patent Reference 1] Japanese Patent Unexamined Publication No. 2001-15554

[Patent Reference 2] Japanese Patent Unexamined Publication No. 2005-175261

[Patent Reference 3] Japanese Patent Unexamined Publication No. 2004-207296

However, in some semiconductor chips of recent years, connection parts are formed in the peripheral edge corresponding to four sides of the semiconductor chip and are further formed in the center of the semiconductor chip. FIG. 9 is a diagram showing one example of a mounting substrate corresponding to a semiconductor chip of a type in which connection parts to the mounting substrate are also formed in the center in addition to the peripheral edge.

Referring to FIG. 9, a mounting substrate 20 shown in the present drawing has a structure in which connection pads 23A, 23B for being connected to a semiconductor chip are formed in an insulating layer 21. The connection pads 23A are arranged in substantially quadrilateral shape in correspondence with the peripheral edge of a semiconductor chip 24 mounted. On the other hand, the connection pads 23B are installed in correspondence with the vicinity of the center of the semiconductor chip so as to be surrounded by the connection pads 23A arranged.

Both ends of the connection pads 23A are respectively covered with solder resist layers 22A, 22B. Also, openings 22b are formed in the solder resist layers 22B and parts of the connection pads 23B are formed so as to be exposed from the openings 22b.

The semiconductor chip 24 to be mounted on the mounting substrate 20 has a structure in which connection parts are respectively formed in both of the peripheral edge corresponding to four sides of the semiconductor chip 24 and the center surrounded by the peripheral edge (not shown) and the respective connection parts are connected to the connection pads 23A, 23B.

Also, a resin called an underfill is infiltrated between the semiconductor chip 24 and the mounting substrate 20, and insulation of adjacent connection parts (connection pads) is achieved.

However, in the mounting substrate 20 described above, there were cases where a problem arises in infiltration of an underfill. For example, there were cases where it is difficult to infiltrate the underfill into the openings 22b and a problem of generating space called a void arises. In this case, there were problems that it is difficult for the underfill to infiltrate into a narrow gap between the semiconductor chip and the mounting substrate and reach the openings 22b and in the openings 22b, a void occurs in the underfill and reliability of insulation reduces and reliability of mounting of the semiconductor chip reduces.

SUMMARY

Embodiments of the present invention provide a mounting substrate and a semiconductor device in which a semiconductor chip is mounted on the mounting substrate.

Embodiments of the present invention provide a mounting substrate with high reliability of mounting of the case of mounting a semiconductor chip in a flip chip manner, and a semiconductor device in which the semiconductor chip is mounted on the mounting substrate.

In the first viewpoint of one or more embodiments of the invention a mounting substrate for mounting a semiconductor chip in a flip chip manner, comprises a plurality of connection pads to which the semiconductor chip is connected, an insulating pattern formed so as to cover a part of the connection pads, and a plurality of dummy patterns for controlling a flow of an underfill infiltrated below the semiconductor chip. The plurality of dummy patterns may be arranged in lattice shape or in staggered lattice shape.

According to the embodiments of the invention, a mounting substrate with high reliability of mounting of the case of mounting a semiconductor chip in a flip chip manner can be provided.

Also, when the insulating pattern and the dummy patterns are made of solder resist material, the insulating pattern and the dummy patterns can be formed easily in the same step.

Also, when the plurality of connection pads include first connection pads arranged in substantially quadrilateral shape in correspondence with the peripheral edge of the semiconductor chip and second connection pads installed so as to be surrounded by the first connection pads, a semiconductor device in which connection pads are formed in both of the peripheral edge and the center surrounded by the peripheral edge can be mounted.

When the second connection pads are connected to a ground line or a power source line of the semiconductor chip, a semiconductor chip of low-voltage handling can be mounted.

Also, when the insulating pattern includes a first insulating pattern continuously formed so as to cover the first ends of the plurality of first connection pads, a second insulating pattern continuously formed so as to cover the second ends of the plurality of first connection pads, and a plurality of third insulating patterns formed so as to individually cover the ends of the plurality of second connection pads, reliability at the time of mounting the first connection pads and the second connection pads improves.

Also, when the dummy patterns are placed in the vicinity of the second connection pads, uniformity of an underfill with which the periphery of the second connection pads is filled improves.

Also, when the dummy patterns are formed in substantially rectangular shape in the case of being viewed from the plane, an effect of suppressing formation of a void in an underfill becomes large.

Also, in the case of satisfying $0.1X \leq a \leq 10X$ when a length of one side in a first direction which is a longitudinal direction of substantially the rectangular shape is set at a and a distance between the dummy patterns adjacently installed in the first direction is set at X in the case of viewing the dummy patterns from the plane, the effect of suppressing formation of a void in an underfill becomes larger.

Also, in the case of satisfying $0.1X \leq b \leq 10X$ when a length of one side in a second direction orthogonal to the first direction is set at b in the case of viewing the dummy patterns from the plane, the effect of suppressing formation of a void in an underfill becomes larger.

Also, in the second viewpoint of one or more embodiments of the invention, a semiconductor device comprises amounting substrate, a semiconductor chip mounted on the mounting substrate in a flip chip manner, wherein the mounting substrate has a plurality of connection pads to which the semiconductor chip is connected, an insulating pattern formed so as to cover a part of the connection pads, and a plurality of dummy patterns for controlling a flow of an underfill infiltrated below the semiconductor chip, and the plurality of dummy patterns are arranged in lattice shape. The plural dummy patterns may be arranged in staggered lattice shape.

According to the embodiments of the invention, a semiconductor device in which a semiconductor chip is mounted on a mounting substrate with high reliability of mounting can be provided.

Various implementations may include one or more the following advantages. For example, a mounting substrate with high reliability of mounting of the case of mounting a semiconductor chip in a flip chip manner and a semiconductor device in which the semiconductor chip is mounted on the mounting substrate can be provided.

Other features and advantages may be apparent from the following detailed description, the accompanying drawings and the claims.

DETAILED DESCRIPTION

Next, embodiments of the invention will be described below based on the drawings.

First Embodiment

Figure 1:
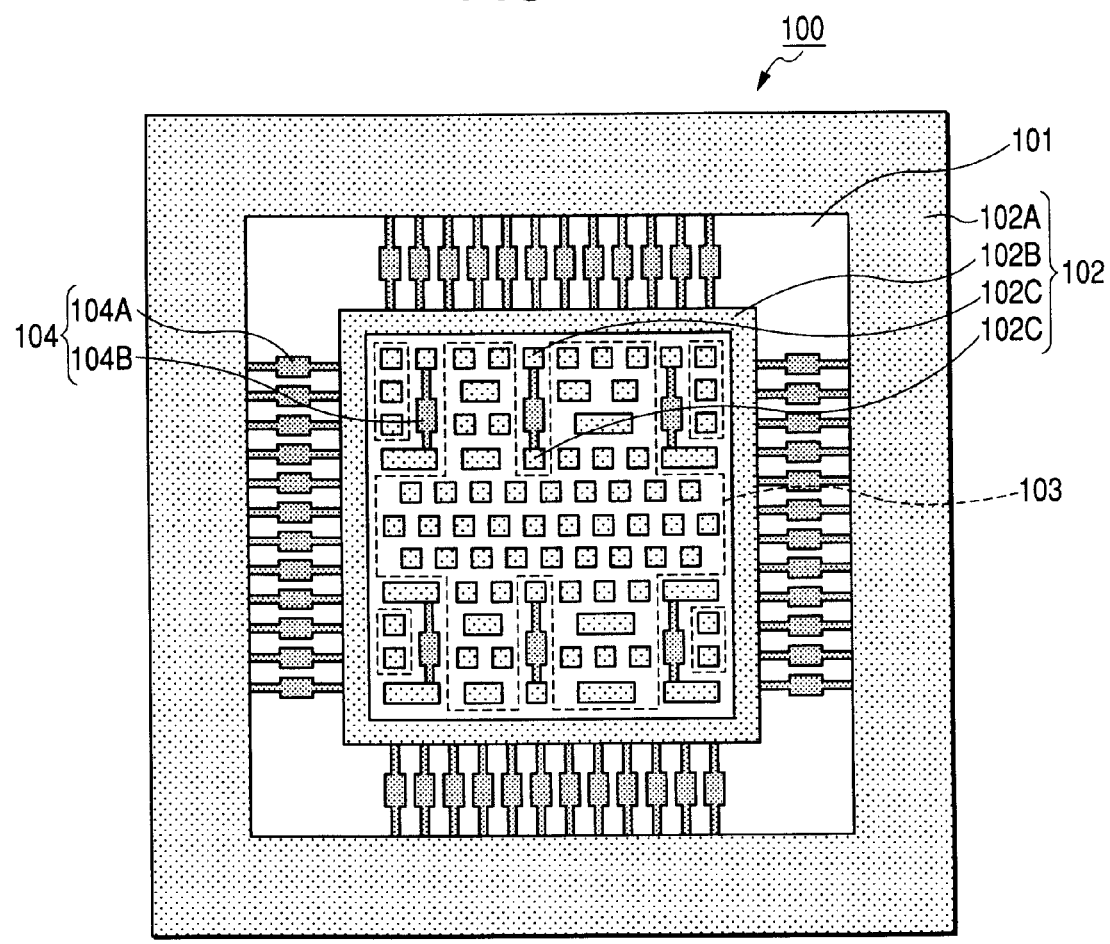
FIG. 1 is a diagram showing a configuration example of a mounting substrate according to a first embodiment.

FIG. 1 is a plan diagram schematically showing a mounting substrate 100 according to a first embodiment of the invention. Referring to FIG. 1, the mounting substrate 100 for mounting a semiconductor chip in a flip chip manner according to the present embodiment has a plurality of connection pads 104, to which the semiconductor chip is connected, formed in an insulating layer (for example, a build-up layer) 101, and an insulating pattern 102 formed so as to cover a part of the connection pads 104. Also, multilayer wiring (not shown) connected to the connection pads 104 is formed in a lower layer of the insulating layer 101.

Further, the mounting substrate 100 according to the embodiment has a feature in which a plurality of dummy patterns 103 for controlling a flow of an underfill infiltrated below the mounted semiconductor chip (between the semiconductor chip and the mounting substrate) are formed and the plurality of dummy patterns 103 are arranged in staggered lattice shape.

For example, the insulating pattern 102 is constructed of solder resist material since the insulating pattern 102 is used as a flow stop of solder used in mounting. In this case, when the dummy patterns are also formed by the same solder resist material as that of the insulating pattern 102, the insulating pattern and the dummy patterns can be formed simultaneously and this is preferable.

Figure 9:
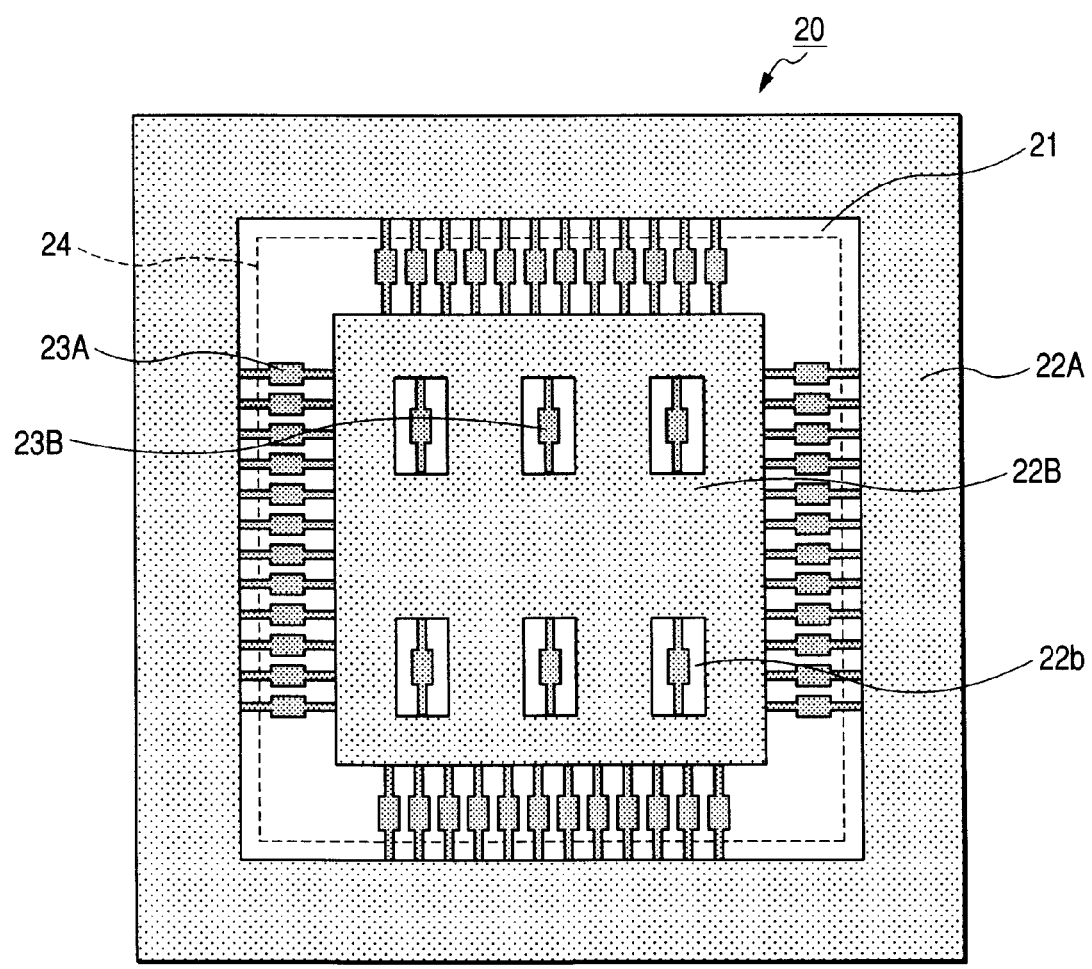
FIG. 9 is a diagram showing a configuration example of a mounting substrate.

Because of having the structure described above, the mounting substrate 100 has an effect of easily infiltrating the underfill between the semiconductor chip and the mounting substrate. For example, in the case of the mounting substrate described previously in FIG. 9, there were cases where the underfill does not reach the openings 22b easily and a void occurs in the underfill. On the other hand, in the mounting substrate 100 according to the embodiment, the dummy patterns 103 for controlling a flow of an underfill are arranged on the insulating layer 101 in staggered lattice shape, so that the underfill easily infiltrates between the dummy patterns 103. As a result of this, an effect of suppressing occurrence of a void in the underfill and improving reliability of mounting of the semiconductor chip is obtained.

Also, in the mounting substrate 100 described above, the plurality of connection pads 104 are constructed so as to include first connection pads 104A arranged in substantially quadrilateral shape in correspondence with the peripheral edge of the semiconductor chip mounted and second connection pads 104B installed so as to be surrounded by the first connection pads 104A arranged.

In this case, for example, the second connection pads 104B are connected to a ground line or a power source line of the semiconductor chip mounted. Particularly in semiconductor chips of recent years, there is a demand for power savings (low-voltage handling) and for the low-voltage handling, it is preferable to form a line (a power source line or a ground line) of a power source system in the vicinity of the center in which a device of a semiconductor chip is formed. As a result of this, the semiconductor chips of low-voltage handling of recent years maybe configured to additionally install a line of a power source system in the vicinity of the center of the semiconductor chip in order to enhance the power source system line.

Figure 2:
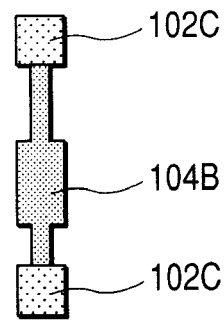
FIG. 2 is a diagram showing a connection pad used in the mounting substrate of FIG. 1.

In the case of the configuration described above, the insulating pattern 102 has a first insulating pattern 102A continuously formed so as to cover the first ends (outside ends) of the plurality of first connection pads 104A and a second insulating pattern 102B continuously formed so as to cover the second ends (inside ends) of the plurality of first connection pads 104A. Further, the insulating pattern 102 is constructed so as to include a plurality of third insulating patterns 102C formed so as to individually cover the ends of the plurality of second connection pads 104B. FIG. 2 shows an example of a configuration of the connection pad 104B and the insulating patterns 102C of the mounting substrate 100 and as illustrated in the drawing, both ends of the connection pad 104B are constructed so as to be covered with the insulating patterns 102C individually.

That is, the second insulating pattern 102B is formed so as to surround the third insulating patterns 102C and the first insulating pattern 102A is formed so as to surround the second insulating pattern 102B, and the respective insulating patterns (solder resists) 102A, 102B, 102C form a flow stop of melted metal such as solder in the case of being connected to the semiconductor chip and improve reliability of mounting.

Also, the dummy patterns 103 are placed in the vicinity of the second connection pads 104B (between adjacent second connection pads 104B) so as to be surrounded by the second insulating pattern 102B. As a result of this, the dummy patterns 103 has an effect of improving uniformity of an underfill infiltrated in the vicinity of the second connection pads 104B particularly, and improves reliability of mounting by suppressing formation of a void in the underfill.

In this case, a method for more improving infiltration of the underfill without forming the dummy patterns 103 is also contemplated. However, various wiring etc. omitted in illustration in addition to the connection pads 104A, 104B are formed in the insulating layer 101. As a result of this, when the insulating layer 101 is not covered with a solder resist at all, there is a fear that reliability of a semiconductor device reduces by a short circuit etc. in wiring at the time of mounting a semiconductor chip.

Therefore, in order to prevent a short circuit by solder etc., the insulating layer 101 is preferably covered with a solder resist etc. to some extent, and also preferably has a structure in which the solder resist does not block infiltration of the underfill as much as possible.

As a result of that, in the mounting substrate 100 described above, a predetermined area of the insulating layer 101 in which the connection pads are formed is covered with the dummy patterns 103 and thereby, the possibility of a short circuit in wiring at the time of mounting the semiconductor chip is decreased and also infiltration of the underfill is facilitated and reliability of mounting of the semiconductor chip is improved.

Also, the dummy patterns 103 can be formed in various shapes and as one example, when the dummy patterns 103 are formed in substantially rectangular shape in the case of being viewed from the plane, a flow of the underfill improves and this is preferable.

Figure 3:
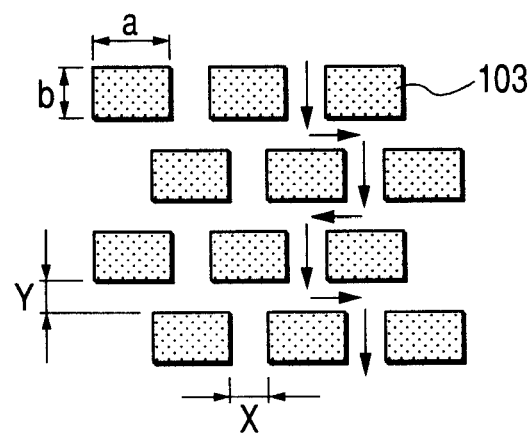
FIG. 3 is a diagram showing a configuration of dummy patterns used in the mounting substrate of FIG. 1.

FIG. 3 is a diagram schematically showing one example of arrangement of the dummy patterns 103. Referring to FIG. 3, when the dummy patterns 103 are arranged in staggered lattice shape as described above, a flow of an underfill improves and occurrence of a void is suppressed and this is preferable. In this case, the underfill flows so as to meander between staggered lattices as shown by arrows in the drawing.

Also, for example, when a length of one side in a longitudinal direction of substantially rectangular shape is set at a and a length of one side in a second direction orthogonal to the first direction is set at b and a distance between the dummy patterns adjacently installed in the first direction is set at X and a distance between the dummy patterns adjacent in the second direction is set at Y in the case of viewing the dummy patterns 103 from the plane, it is preferable to set a relation among these as follows in order to suppress formation of a void in the underfill. In addition, in this case, it is assumed that the underfill is introduced along the second direction.

First, with respect to a relation between X and a, it is preferable to satisfy $0.1X$(one-tenth X)$\leq a \leq 10X$(ten times X). In this case, formation of a void to an underfill can be suppressed efficiently. Also, with respect to a relation between X and b, it is more preferable to satisfy $0.1X \leq b \leq 10X$. In this case, formation of a void to an underfill can be suppressed more efficiently. When a and b are too large with respect to X in this case, it is checked that the void tends to occur, and with respect to suppression of the void, it is preferable to set a and b at ten times or less with respect to X as described above. Also, it is preferable to set lower limit values of a and b at one-tenth or more X from a problem of processing accuracy.

Similarly, with respect to relations between Y and a, b, it is preferable to satisfy a relation of $0.1Y \leq a \leq 10Y$ and it is more preferable to satisfy a relation of $0.1Y \leq b \leq 10Y$.

Also, it is preferable that a length of b satisfies $0.1\,a$ (one-tenth a)$\leq b \leq 3\,a$(three times a) in order to suppress the void.

For example, in the case of using an underfill with viscosity of a regularly used extent, it is concretely preferable to set the length b at 500 μm or less and set the distance X at 30 μm or more.

Figure 4:
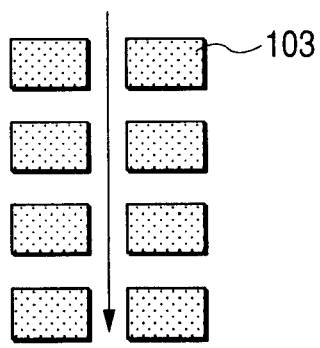
FIG. 4 is a diagram showing a modified example of FIG. 3.

Also, FIG. 4 is a diagram showing a modified example of arrangement of the dummy patterns 103 shown in FIG. 3. Referring to FIG. 4, the dummy patterns 103 are arranged in normal lattice shape in the case shown in the diagram. Also in this case, an effect of suppressing occurrence of a void of an underfill infiltrated is obtained to some extent, but it is found out that the effect of suppressing occurrence of a void is larger in the case of being arranged as shown in FIG. 3 by inventors of the invention.

In the case of arranging the dummy patterns 103 as shown in FIG. 4, an underfill mainly flows in a substantially straight line (longitudinal direction in the drawing) as shown by an arrow in the drawing, and flows in a transverse direction by branching from this straight flow. As a result of this, it is checked that infiltration of the underfill in the transverse direction is better in the case of FIG. 3 in which the underfill flows meanderingly by an experiment of inventors of the invention.

Also, the dummy patterns 103 are preferably placed so that a longitudinal direction is substantially orthogonal to a flow direction of the underfill. In this case, the effect of suppressing a void of the underfill becomes larger.

Second Embodiment

Figure 5:
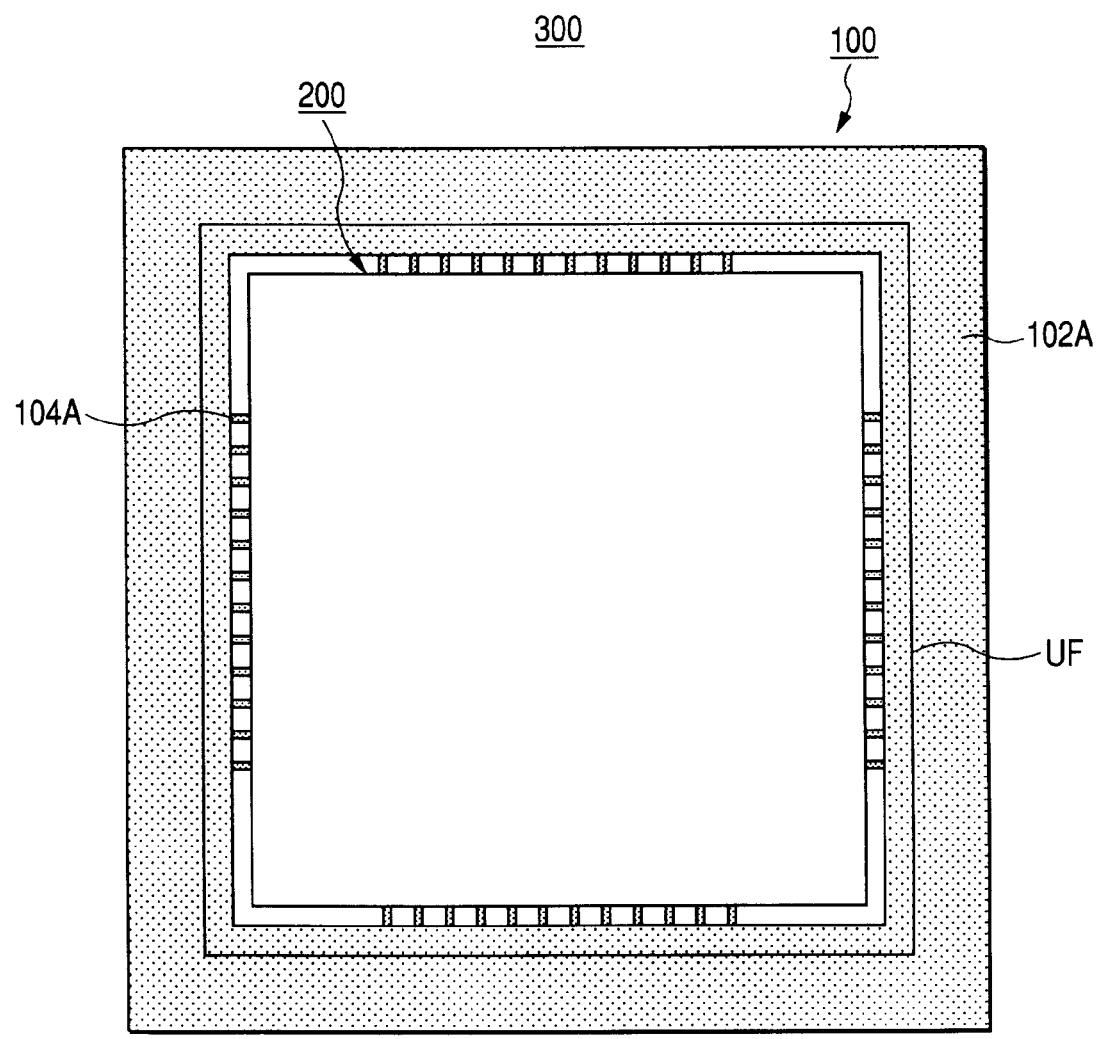
FIG. 5 is a diagram showing a semiconductor device according to a second embodiment.

Also, FIG. 5 is a plan diagram schematically showing a semiconductor device 300 according to a second embodiment of the invention. However, in the drawing, the same reference numerals are assigned to the parts described previously and the description is omitted.

Referring to FIG. 5, the semiconductor device 300 according to the present embodiment has a structure in which a semiconductor chip 200 is mounted on the mounting substrate 100 previously described in the first embodiment. Also, an underfill UF is infiltrated between the semiconductor chip 200 and the mounting substrate 100. The semiconductor device 300 according to the embodiment has an effect similar to that of the case of being previously described in the first embodiment and, for example, occurrence of a void in the underfill UF is suppressed and reliability of mounting of the semiconductor chip improves.

Figure 6:
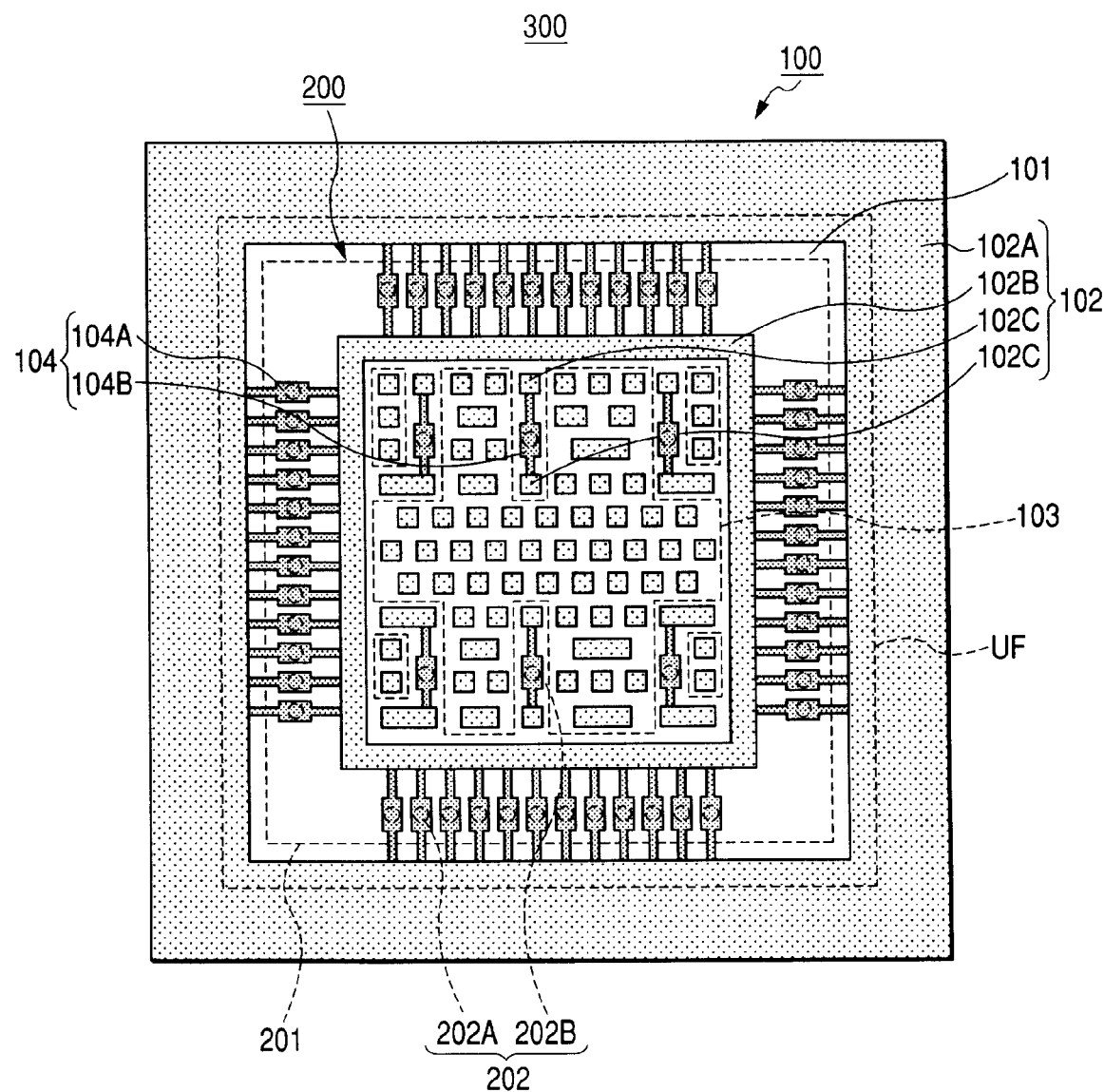
FIG. 6 is a diagram showing the semiconductor device according to the second embodiment.
Figure 7B:
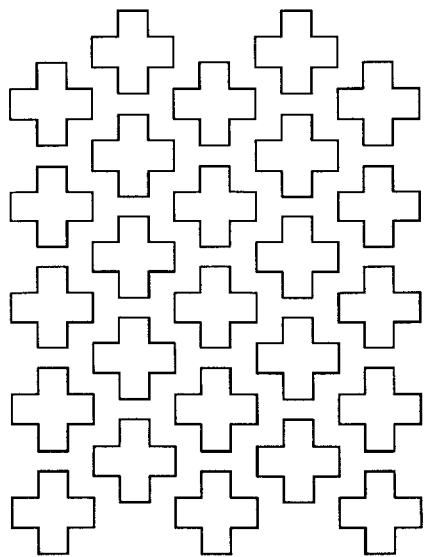
FIGS. 7A to 7D are diagram showing modified examples of configuration of dummy patterns.
Figure 7D:
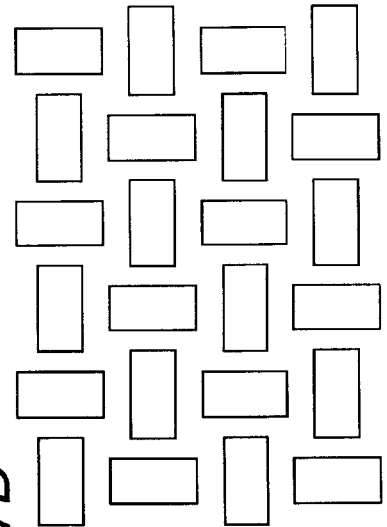
Figure 7A:
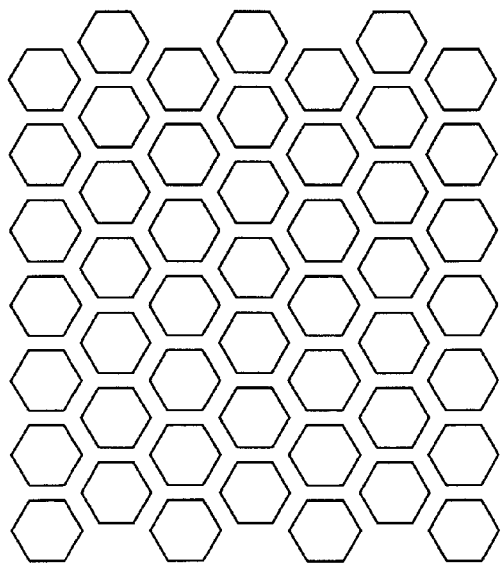
Figure 7C:
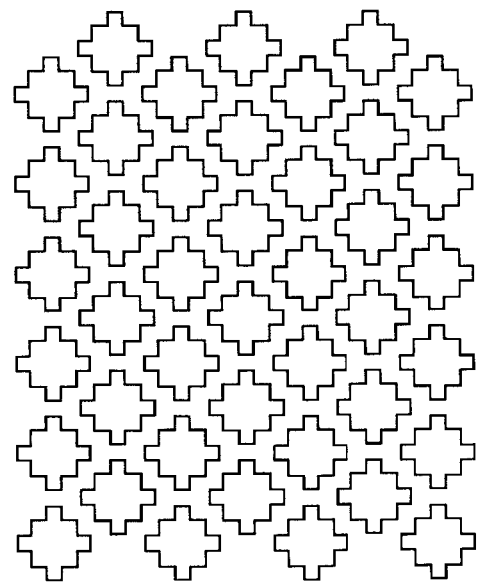
Figure 8:
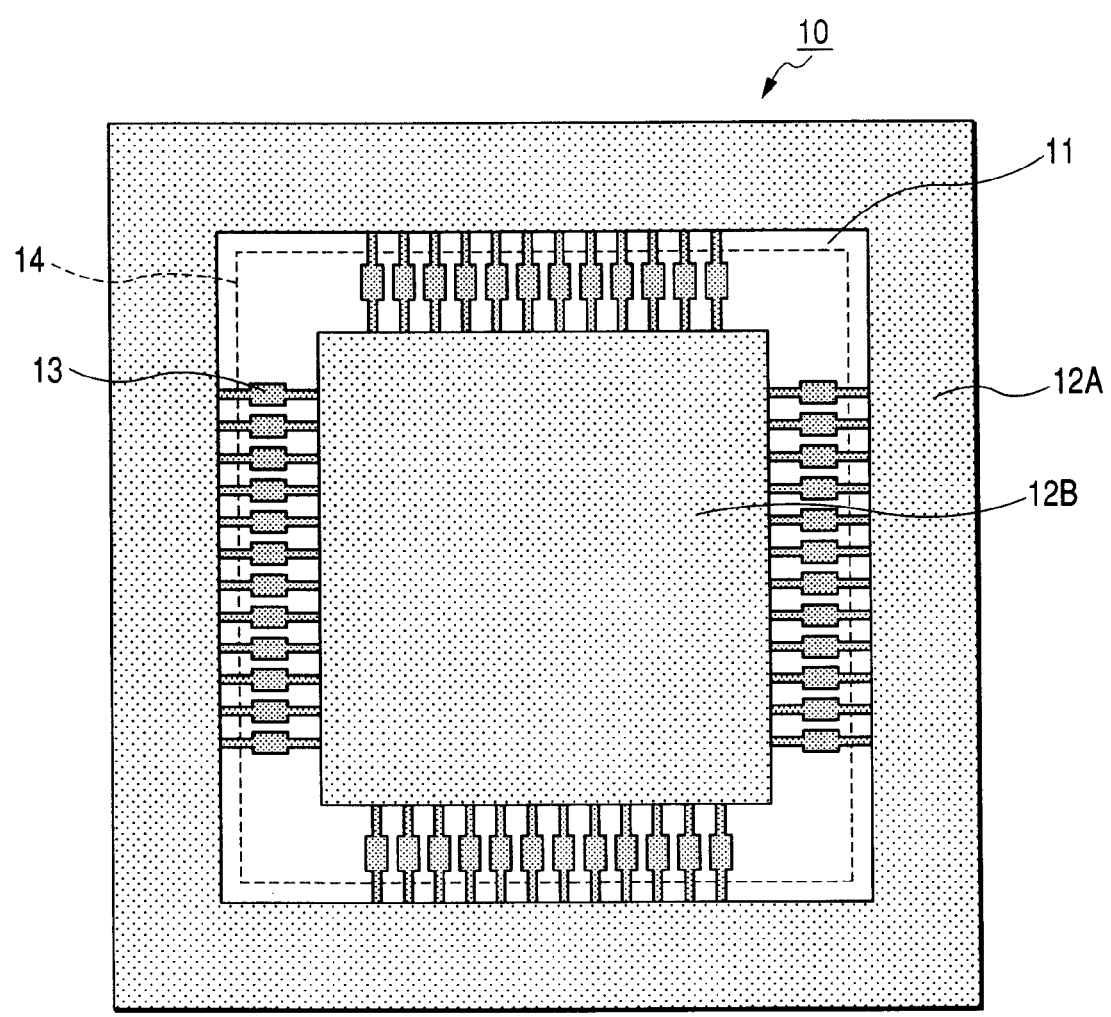
FIG. 8 is a diagram showing a configuration example of a mounting substrate.

Also, FIG. 6 is a diagram described in a form of viewing the mounting substrate with the semiconductor chip 200 transmitted for convenience so that a position relation between the semiconductor chip 200 and the mounting substrate 100 is easy to understand in the semiconductor device 300 of FIG. 5. However, in the drawing, the same reference numerals are assigned to the parts described previously and the description is omitted.

Referring to FIG. 6, the semiconductor chip 200 has a chip body 201 and a plurality of connection parts 202 connected to the connection pads 104 and formed in the chip body 201. The connection parts 202 have a structure made by, for example, forming solder bumps in electrode pads (both are not shown). Also, the connection parts 202 are constructed so as to include first connection parts 202A arranged in substantially quadrilateral shape in correspondence with the peripheral edge of the chip body 201 and second connection parts 202B installed so as to be surrounded by the first connection parts 202A arranged.

In this case, for example, the second connection parts 202B handle a ground line or a power source line of the semiconductor chip. As described above, particularly in semiconductor chips of recent years, there is a demand for power savings (low-voltage handling) and for the low-voltage handling, it may be configured to additionally install a line of a power source system in the vicinity of the center of the semiconductor chip. In the structure described above, the connection parts 202A are connected to the connection pads 104A and also the connection parts 202B are connected to the connection pads 104B, respectively. That is, the semiconductor device 300 according to the embodiment can handle low voltage and also has a feature in which reliability of mounting is good.

Also, in a semiconductor device of recent years, there is a demand for thinning and a distance between a semiconductor chip and a mounting substrate becomes shorter and it becomes difficult to infiltrate an underfill, but the invention is a useful technique of handling the thinning of such a semiconductor device.

Also, the structures shown in the first and second embodiments described above are one example of the embodiments of the invention, and the invention is not limited to the specific embodiments, and various modifications and changes can be made within the gist described in the claims.

For example, the shape of the dummy patterns 103 is not limited to the shape as shown in FIGS. 3 or 4. The dummy patterns 103 can be formed in various shapes as shown in FIGS. 7A to 7D.

According to the invention, a mounting substrate with high reliability of mounting of the case of mounting a semiconductor chip in a flip chip manner and a semiconductor device in which the semiconductor chip is mounted on the mounting substrate can be provided.

What is claimed is:

1. A semiconductor device comprising:
a mounting substrate; and
a semiconductor chip mounted on the mounting substrate in a flip chip manner,
wherein the mounting substrate has a plurality of connection pads to which the semiconductor chip is connected, an insulating pattern formed of a solder resist material so as to cover a part of the connection pads, and a plurality of dummy patterns formed of a solder resist material for controlling a flow of an underfill infiltrated between the semiconductor chip and the mounting substrate, and
wherein the plurality of connection pads include:
first connection pads connected to a peripheral edge of the semiconductor chip; and
at least one second connection pad connected to the semiconductor chip at a position that is spaced from the peripheral edge of the semiconductor chip such that the at least one second connection pad is surrounded by the first connection pads,
wherein the dummy patterns are arranged in lattice shape surrounding the at least one second connection pad and forming a flow path that directs the underfill to surround the at least one second connection pad, and the dummy patterns are surrounded by the first connection pads.

2. A semiconductor device comprising:
a mounting substrate; and
a semiconductor chip mounted on the mounting substrate in a flip chip manner,
wherein the mounting substrate has a plurality of connection pads to which the semiconductor chip is connected, an insulating pattern formed of a solder resist material so as to cover a part of the connection pads, and a plurality of dummy patterns formed of a solder resist material for controlling a flow of an underfill infiltrated below the semiconductor chip, the dummy patterns being arranged in a staggered lattice shape, and
wherein the plurality of connection pads include:
first connection pads connected to a peripheral edge of the semiconductor chip; and
at least one second connection pad connected to the semiconductor chip at a position that is spaced from the peripheral edge of the semiconductor chip such that the at least one second connection pad is surrounded by the first connection pads,
wherein the at least one second connection pad is surrounded by the dummy patterns, and the dummy patterns are surrounded by the first connection pads.

3. The semiconductor device according to claim 1, wherein the dummy patterns are comprised of a plurality of rectangular shaped projections that are spaced from one another.

4. The semiconductor device according to claim 2, wherein the dummy patterns are comprised of a plurality of rectangular shaped projections that are spaced from one another.

5. The semiconductor device according to claim 2, wherein the dummy patterns are arranged to form a flow path that directs the underfill resin to surround the at least one second connection pad.

* * * * *